(12) United States Patent
Baek et al.

(10) Patent No.: US 8,604,558 B2
(45) Date of Patent: Dec. 10, 2013

(54) SEMICONDUCTOR DEVICE HAVING IMPROVED RELIABILITY

(75) Inventors: Cheol-ho Baek, Yongin-si (KR); Hyeong-sun Hong, Seongnam-si (KR); Yoo-sang Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 278 days.

(21) Appl. No.: 13/032,041

(22) Filed: Feb. 22, 2011

(65) Prior Publication Data

US 2011/0221010 A1 Sep. 15, 2011

(30) Foreign Application Priority Data

Mar. 10, 2010 (KR) .................. 10-2010-0021383

(51) Int. Cl.
*H01L 23/48* (2006.01)
*H01L 29/78* (2006.01)

(52) U.S. Cl.
USPC .............. 257/401; 257/774; 257/E23.011; 257/E29.255

(58) Field of Classification Search
USPC .............. 257/401, 774, E23.011, E29.255
See application file for complete search history.

(56) References Cited

U.S. PATENT DOCUMENTS

2008/0284029 A1* 11/2008 Kim et al. ............... 257/758

FOREIGN PATENT DOCUMENTS

| KR | 10 2008-030385 A | 4/2008 |
|----|------------------|--------|
| KR | 2008-0030385 | 4/2008 |
| KR | 10-0843716 | 6/2008 |
| KR | 10-0843716 B1 | 6/2008 |
| KR | 10-0846099 | 7/2008 |
| KR | 10-0846099 B1 | 7/2008 |

* cited by examiner

*Primary Examiner* — Whitney T Moore
(74) *Attorney, Agent, or Firm* — Lee & Morse, P.C.

(57) ABSTRACT

A semiconductor includes a plurality of active regions that are separated from each other on a substrate by a device isolation layer and extend in a first direction, the active regions having two opposite ends and a center region; wordlines that are buried in and cross the active regions and extend in a second direction, which is different from the first direction, wherein a wordline that crosses an active region crosses between one of the two opposite ends and the center region of the active region; first contact plugs on the two opposite ends of the active regions, each contact plug overlapping a border between the active region and the device isolation layer; and second contact plugs formed on the first contact plugs.

19 Claims, 17 Drawing Sheets

SECOND DIRECTION

SEMICONDUCTOR DEVICE HAVING IMPROVED RELIABILITY

BACKGROUND

1. Field

The disclosure relates to a semiconductor device, and more particularly, to a semiconductor device having improved reliability.

2. Description of the Related Art

Due to increased integration of semiconductor devices, patterning process techniques may reduce an area of a unit cell in a dynamic random access memory (DRAM). However, as the area of a unit cell decreases, misalignment may occur during the patterning process. Due to the misalignment, a contacting area between a storage contact plug and an active region may be reduced, and thus reliability of a semiconductor device may be deteriorated.

SUMMARY

According to an embodiment, there is provided a semiconductor device including a plurality of active regions that are separated from each other on a substrate by a device isolation layer and extend in a first direction, wordlines that are buried in the active regions between two opposite ends of the active regions and center regions of the active regions, cross the active regions, and extend in a second direction, which is different from the first direction, first contact plugs formed on the two opposite ends of the active regions, and second contact plugs formed on the first contact plugs, wherein each of the first contact plugs overlaps a border between the two opposite ends of the active regions and the device isolation layer.

A length of each of the first contact plugs in the second direction may be greater than a length of each of the active regions in the second direction.

A length of each of the first contact plugs in the second direction may be greater than a length of each of the second contact plugs in the second direction.

The semiconductor device may further include third contact plugs on the center regions of the active regions. In a direction perpendicular to the first direction and the second direction, a height of the third contact plugs and a height of the first contact plugs may be substantially the same.

On a section obtained along a centerline of the first contact plugs that are adjacent to each other in the second direction, some of the second contact plugs may be arranged substantially along first ends of respective first contact plugs to form L-shaped contact plugs.

On the section obtained along the centerline of the first contact plugs that are adjacent to each other in the second direction, others of the second contact plugs may be arranged substantially along second ends of respective first contact plugs to form reversed L-shaped contact plugs.

The semiconductor device may further include a first bitline on the device isolation layer. On the section obtained along the centerline of the first contact plugs that are adjacent to each other in the second direction, at least one of the L-shaped contact plugs and at least one of the reverse L-shaped contact plugs may be symmetrical to each other about the first bitline.

The semiconductor device may further include a second bitline in the active region. On the section obtained along the centerline of the first contact plugs that are adjacent to each other in the second direction, at least one of the L-shaped contact plugs and at least one of the reverse L-shaped contact plugs may be symmetrical to each other about the second bitline.

The first contact plugs may have an elliptical shape.

According to an embodiment, there is provided a semiconductor device having a cell region and a peripheral region, wherein the cell region includes a plurality of active regions that are separated from each other on a substrate by a device isolation layer and extend in a first direction, wordlines that are buried in the active regions between two opposite ends of the active regions and center regions of the active regions, cross the active regions, and extend in a second direction, which is different from the first direction, first contact plugs formed on the two opposite ends of the active regions, and second contact plugs formed on the first contact plugs, and each of the first contact plugs overlaps a border between the two opposite ends of the active regions and the device isolation layer.

A length of each of the first contact plugs in the second direction may be greater than a length of each of the active regions in the second direction.

A length of each of the first contact plugs in the second direction may be greater than a length of each of the second contact plugs in the second direction.

The cell region may further include third contact plugs on the center regions of the active regions, and a plurality of bitlines that are on the third contact plugs and that extend in a direction perpendicular to the second direction. The peripheral region may include at least one active region isolated on the substrate by a device isolation layer, a gate insulation layer on the active region, and a gate electrode on the gate insulation layer. A height of each of the bitlines and a height of the gate electrode may be substantially the same.

The bitlines in the cell region and the gate electrode in the peripheral region may include a same material.

The peripheral region may include a gate conductive layer between the gate insulation layer and the gate electrode, and the gate conductive layer and the first contact plugs may include a same material.

The cell region may include first spacers surrounding sidewalls of the bitlines. The peripheral region may include second spacers surrounding sidewalls of the gate electrode. The thickness of the first spacers and the thickness of the second spacers may be substantially the same.

According to an embodiment, there is provided a plurality of active regions that are separated from each other on a substrate by a device isolation layer and extend in a first direction; wordlines that are buried in the active regions between two opposite ends of the active regions and center regions of the active regions, cross the active regions, and extend in a second direction, which is different from the first direction; first contact plugs formed on the two opposite ends of the active regions; and second contact plugs formed on the first contact plugs, and wherein each of the first contact plugs overlaps a border between the two opposite ends of the active regions and the device isolation layer. The first contact plugs may include a first set of first contact plugs arranged along a first reference line perpendicular to the second direction and a second set of first contact plugs arranged along a second reference line parallel to the first reference line. The second contact plugs may be arranged along a third reference line parallel to the first and second reference lines. The first reference line and the second reference line may be symmetrical to each other about the third reference line.

The first set of first contact plugs may be arranged such that centers thereof are aligned along the first reference line. The second set of first contact plugs are arranged such that centers thereof are aligned along the second reference line. The second contact plugs may be arranged such that centers thereof are aligned along the third reference line.

A length of each of the first contact plugs in the second direction may be greater than a length of each of the active regions in the second direction.

A length of each of the first contact plugs may be greater than a length of each of the second contact plugs in the second direction.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
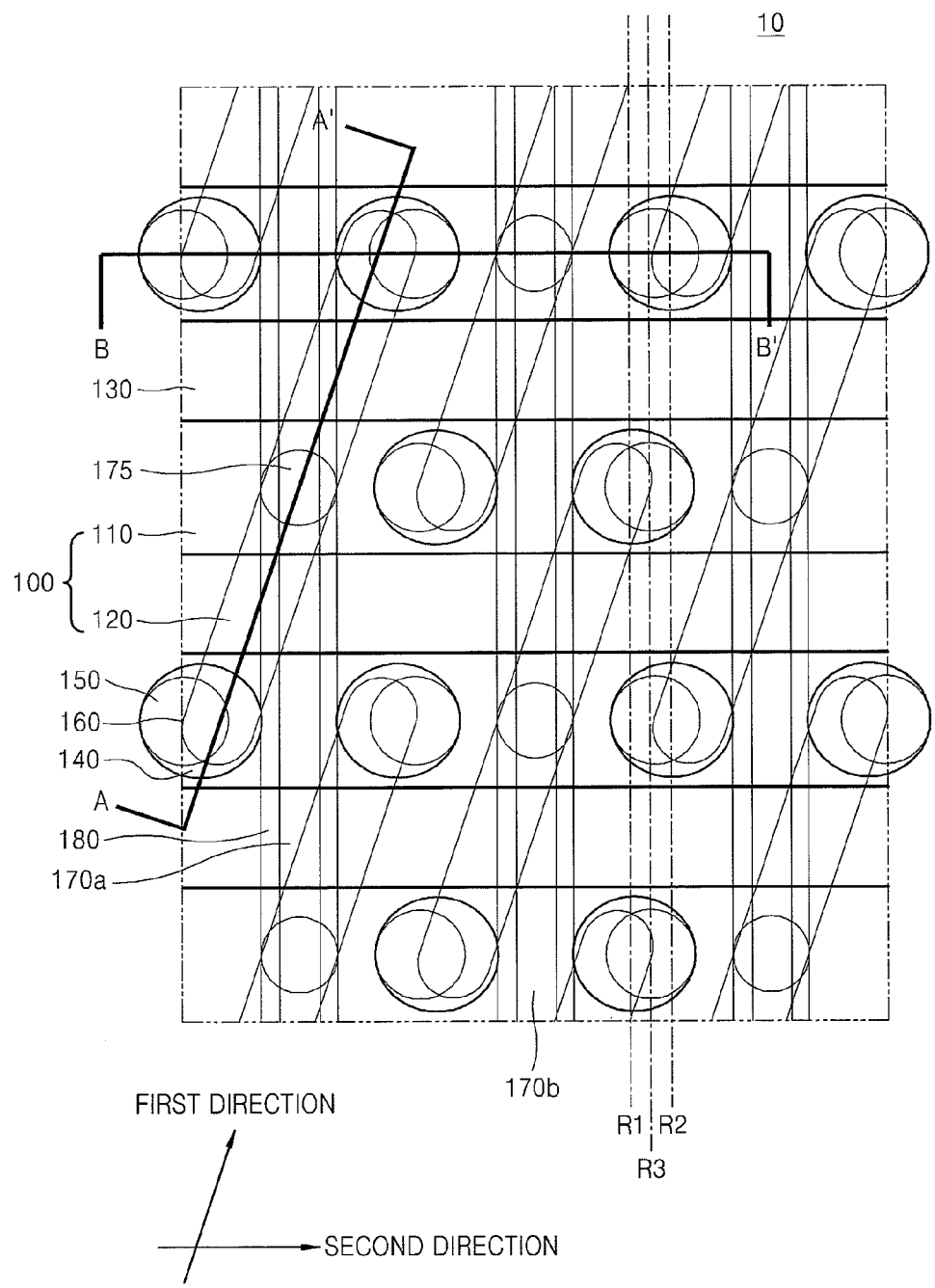
FIG. 1 illustrates a plan view showing a cell region of a semiconductor device, according to an embodiment.

Korean Patent Application No. 10-2010-0021383, filed on Mar. 10, 2010, in the Korean Intellectual Property Office, and entitled: "Semiconductor Device Having Improved Reliability," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Embodiments may be described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

FIG. 1 illustrates a plan view showing a cell region 10 of a semiconductor device, according to an embodiment.

Referring to FIG. 1, the cell region 10 of the semiconductor device may include a substrate 100, which includes active regions 120 and a device isolation layer 110, wordlines 130, first and second bitlines 170a and 170b, first contact plugs 140, second contact plugs 150, and third contact plugs 175.

The substrate 100 may be a semiconductor substrate. For example, the substrate 100 may be a silicon substrate, a silicon-germanium (Si—Ge) substrate, or a silicon-on-insulator (SOI) substrate. The active regions 120 are formed on the substrate 100, and may be separated from each other by the device isolation layer 110. The device isolation layer 110 may be a local oxidization of silicon (LOCOS) type layer or a shallow trench isolation (STI) type layer. The active regions 120 may extend in a first direction. An active region 120 may include two opposite ends and a center region.

Figure 2:
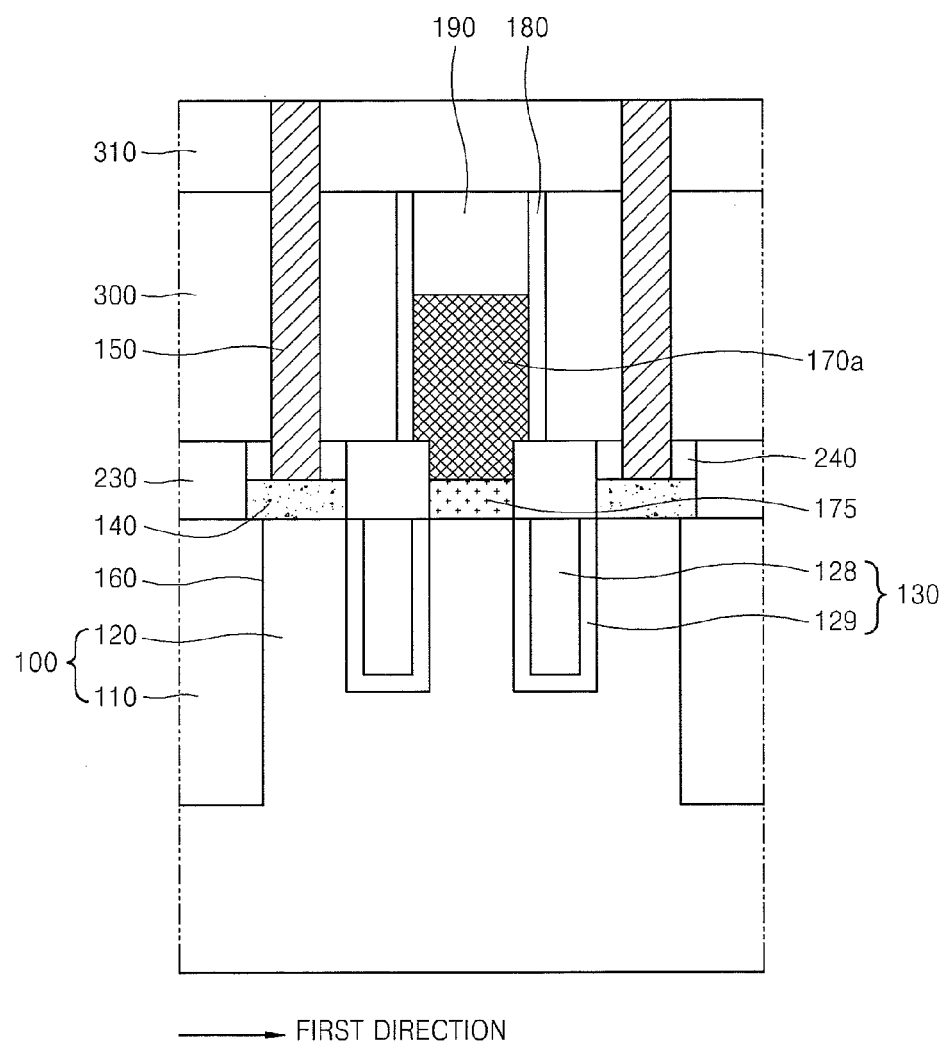
FIG. 2 illustrates a sectional view obtained along a line A-A' of the cell region of the semiconductor device of FIG. 1, according to an embodiment.

The wordlines 130 may be respectively buried in the active regions 120, and may cross the active regions 120. A wordline 130 may be between one of the two opposite ends of the active region 120 and the center region of the active region 120 and may extend in a second direction, which is different from the first direction. Each of the wordlines 130 may include a gate electrode (128 of FIG. 2) and a gate insulation layer (129 of FIG. 2). However, the structure of the wordlines 130 shown in FIGS. 1 and 2 is merely an example, and the embodiments are not limited thereto. The wordlines 130 may be on the active regions 120 or may be buried in the active regions 120.

The first contact plugs 140 may be formed on the two opposite ends of each of the active regions 120. Each of the first contact plugs 140 may be formed to overlap a border 160 between the one of the two opposite ends of the active regions 120 and the device isolation layer 110. The length of each of the first contact plugs 140 in the second direction may be greater than the length of each of the active regions 120 in the second direction. The first contact plugs 140 may have an elliptical shape. For example, the first contact plugs 140 may have an elliptical shape in a plane provided by the first direction and the second direction.

The second contact plugs 150 may be formed on the first contact plugs 140. A length of each of the second contact plugs 150 in the second direction may be less than the length of each of the first contact plugs 140 in the second direction.

Some of the first contact plugs 140 may be arranged along a first reference line R1, which is perpendicular to the second direction. Other ones of the first contact plugs 140 may be arranged along a second reference line R2, which is parallel to the first reference line R1. The second contact plugs 150 may be arranged along a third reference line R3, which is parallel to the first reference line R1 and the second reference line R2. The first reference line R1 and the second reference line R2 may be symmetrically spaced from each other on respective sides of the third reference line R3.

The first contact plugs 140 that are arranged along the first reference line R1 may be arranged such that the centers thereof are aligned along the first reference line R1. The first contact plugs 140 that are arranged along the second reference line R2 may be arranged such that the centers thereof are aligned along the second reference line R2. The second contact plugs 150 may be arranged such that the centers thereof are aligned along the third reference line R3. The first contact plugs 140 and the second contact plugs 150 may be arranged such that the first reference line R1 and the second reference line R2 are symmetrically spaced from each other on respective sides of the third reference line R3.

The third contact plugs 175 may be on the center regions of the active regions 120. In a direction perpendicular to the first direction and the second direction, the height of the third contact plugs 175 and the height of the first contact plugs 140 may be substantially the same.

The first bitline 170a may be on the third contact plug 175. Furthermore, the first and second bitlines 170a and 170b may extend in a direction perpendicular to the second direction. First spacers 180 may be on two opposite side surfaces of the first and second bitlines 170a and 170b.

The first through third contact plugs 140, 150, and 175 may contain at least one of poly-silicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The poly-silicon may be doped with an n-type impurity or a p-type impurity. The first through third contact plugs 140, 150, and 175 may further contain a nitride or a silicide, and may further include barrier layers (not shown) to lower potential walls between junctions. The barrier layer may either be a single layer containing Ti, Ta, or W, or a multi layer, such as a Ti/Ti layer, a Ti/TiN layer, a Ta/TaN layer, or a W/WN layer, for example. However, the materials and the structures of the first through third contact plugs 140, 150, and 175 are merely examples, and the embodiments are not limited thereto.

FIG. 2 illustrates a sectional view obtained along a line A-A' of FIG. 1, and illustrates a sectional view of the cell region 10 of a semiconductor device, according to an embodiment. Repeated descriptions will be omitted below.

Referring to FIG. 2, the first contact plugs 140 may be on the device isolation layer 110 and the active region 120. The first contact plugs 140 may overlap the border 160 between one of the opposite ends of the active regions 120 and the device isolation layer 110. The length of each of the first contact plugs 140 in the second direction may be greater than the length of each of the active regions 120 in the second direction.

The second contact plugs 150 may be on the first contact plugs 140 as described above. The length of each of the second contact plugs 150 in the second direction may be less than the length of each of the first contact plugs 140 in the second direction.

The cell region 10 of the semiconductor device may further include a capping insulation layer 190, a first interlayer insulation layer 230, a second interlayer insulation layer 240, a third interlayer insulation layer 300, and a fourth interlayer insulation layer 310. Processes to form the same will be described below in detail with reference to FIGS. 4A through 4M.

Figure 3:
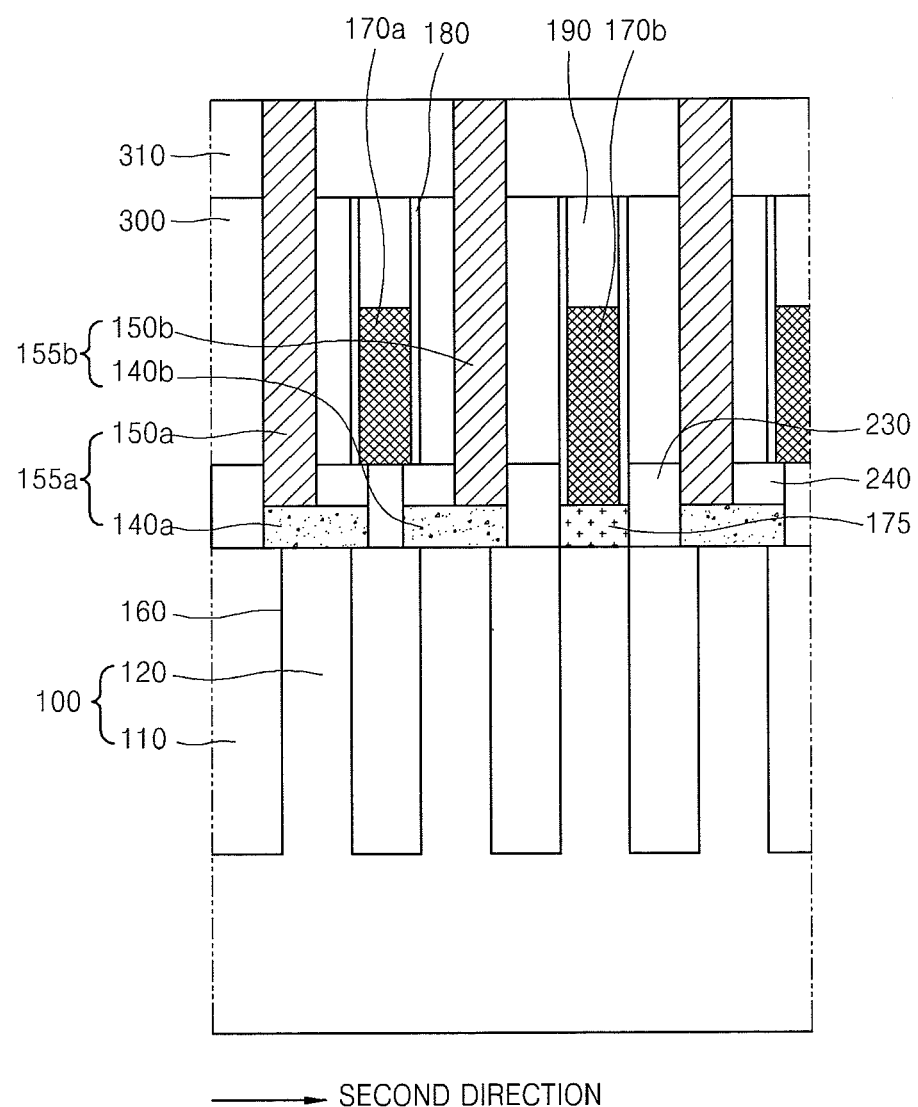
FIG. 3 illustrates a sectional view obtained along a centerline B-B' of first contact plugs adjacent to each other in a second direction of the cell region of the semiconductor device of FIG. 1, according to an embodiment.

FIG. 3 illustrates a sectional view obtained along the centerline B-B' of the first contact plugs 140 adjacent to each other in the second direction of FIG. 1, and illustrates a sectional view of the cell region 10 of a semiconductor device, according to an embodiment. Repeated descriptions will be omitted below.

Referring to FIG. 3, in the second direction, some of the second contact plugs 150a may be arranged substantially along first ends of the first contact plugs 140a. A combined contact plug 155a of the first contact plug 140a and a second contact plug 150a may have an L-shape according to the sectional view. The other second contact plugs 150a may be arranged substantially along second ends of the first contact plugs 140b. A combined contact plug 155b of the first contact plug 140b and the second contact plug 150b may have a reverse L-shape according to the sectional view.

The first bitline 170a may be formed on the device isolation layer 110. The L-shaped contact plug 155a and the reverse L-shaped contact plug 155b may be symmetrical to each other about the first bitline 170a.

The second bitlines 170b may be formed on the active region 120. The L-shaped contact plug 155a and the reverse L-shaped contact plug 155b may be symmetrical to each other about the second bitline 170b.

FIGS. 4A through 4M illustrate sectional views relating to a method of fabricating a semiconductor device, according to an embodiment. FIGS. 4A through 4M each show (a) a sectional view obtained along a line A-A' of FIG. 1, (b) a sectional view obtained along a line B-B' of FIG. 1, and (c) a sectional view of a peripheral region 20.

Figure 4A:
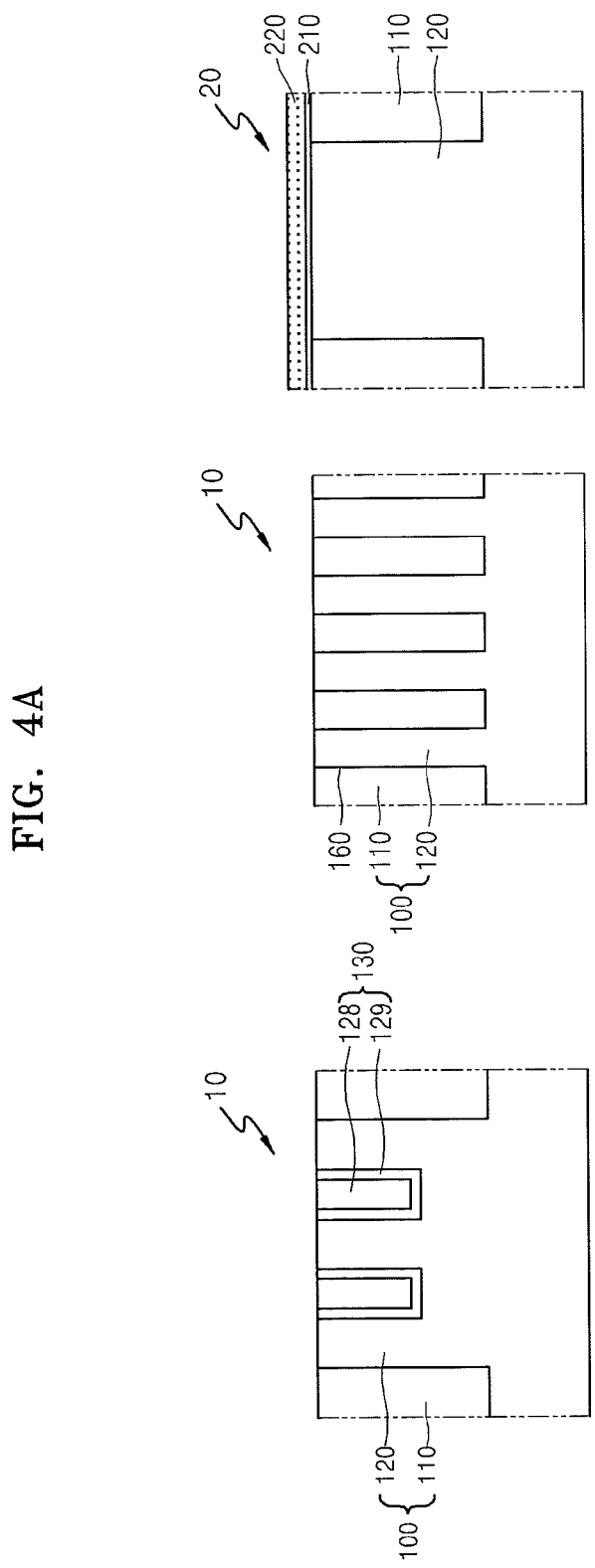
FIGS. 4A through 4M illustrate sectional views showing a method of fabricating a semiconductor device, according to an embodiment, each set of three views illustrating such method by way of a sectional view taken along the line A-A' of FIG. 1, a sectional view taken along the line B-B' of FIG. 1 and a sectional view of a peripheral region.

Referring to FIG. 4A, the device isolation layer 110 and the active regions 120, which are separated from each other by the device isolation layer 110, may be formed in the cell region 10 and the peripheral region 20 of the substrate 100. Then, the wordlines 130 may be formed in the cell region 10 of the substrate 100. Each of the wordlines 130 may be buried in the active region 120 between the one of the two opposite ends of the active region 120 and the center region of the active region 120, as described above.

Next, a gate insulation layer 210 and a gate conductive layer 220 may be formed on the peripheral region 20 of the substrate 100. The gate insulation layer 210 may be a nitride layer, an oxide layer, or an oxynitride layer, for example. The gate insulation layer 210 may be formed by various methods, such as a thermal oxidization method, a rapid thermal oxidization (RTO) method, a chemical vapor deposition (CVD) method, a plasma enhanced CVD (PECVD) method, a sputtering method, of an atomic layer deposition (ALD) method. The gate conductive layer 220 may be formed of the same material as the first through third contact plugs (140, 150, and 175 of FIG. 2) or of a different material.

Figure 4B:
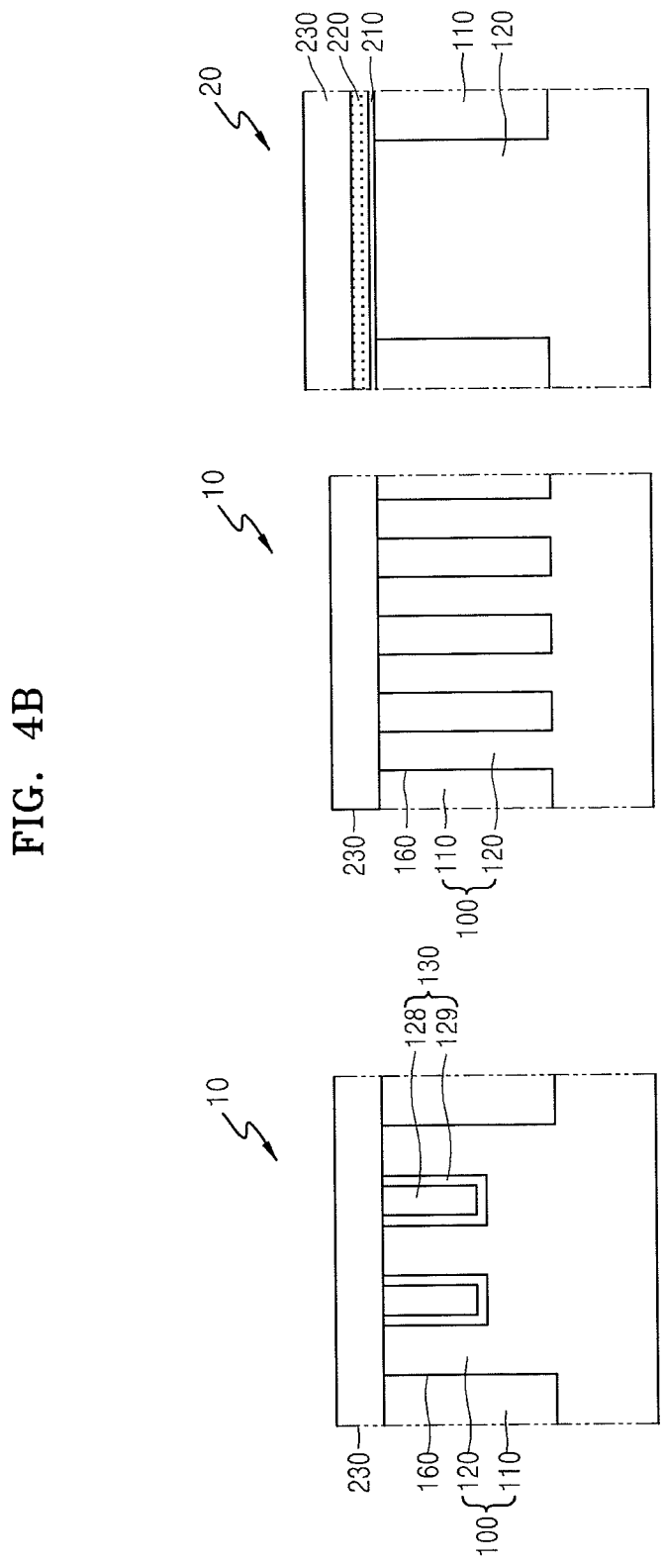

Referring to FIG. 4B, the first interlayer insulation layer 230 may be formed in the cell region 10 and the peripheral region 20. The first interlayer insulation layer 230 may be formed on the device isolation layer 110, the active region 120, and the wordline 130 of the cell region 10 and on the gate conductive layer 220 of the peripheral region 20. The first interlayer insulation layer 230 may be formed of the same material as the gate insulation layer 210 or of a different material.

Figure 4C:
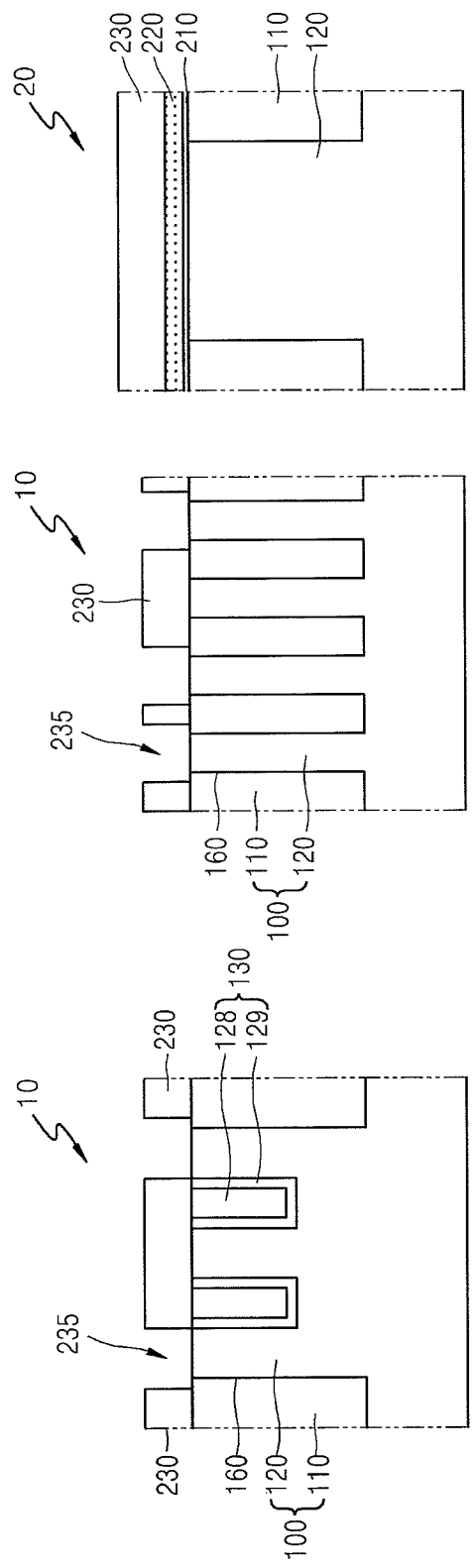

Referring to FIG. 4C, contact holes 235, which expose the two opposite ends of the active regions 120, may be formed by patterning a portion of the first interlayer insulation layer 230 in the cell region 10 of the substrate 100. The contact holes 235 may expose not only the active regions 120, but also the device isolation layer 110. The peripheral region 20 of the substrate 100 may be covered by a photoresist (not shown). Therefore, patterning of the peripheral region 20 of the substrate 100 may be avoided due to the peripheral region 20 being covered by the photoresist.

Figure 4D:
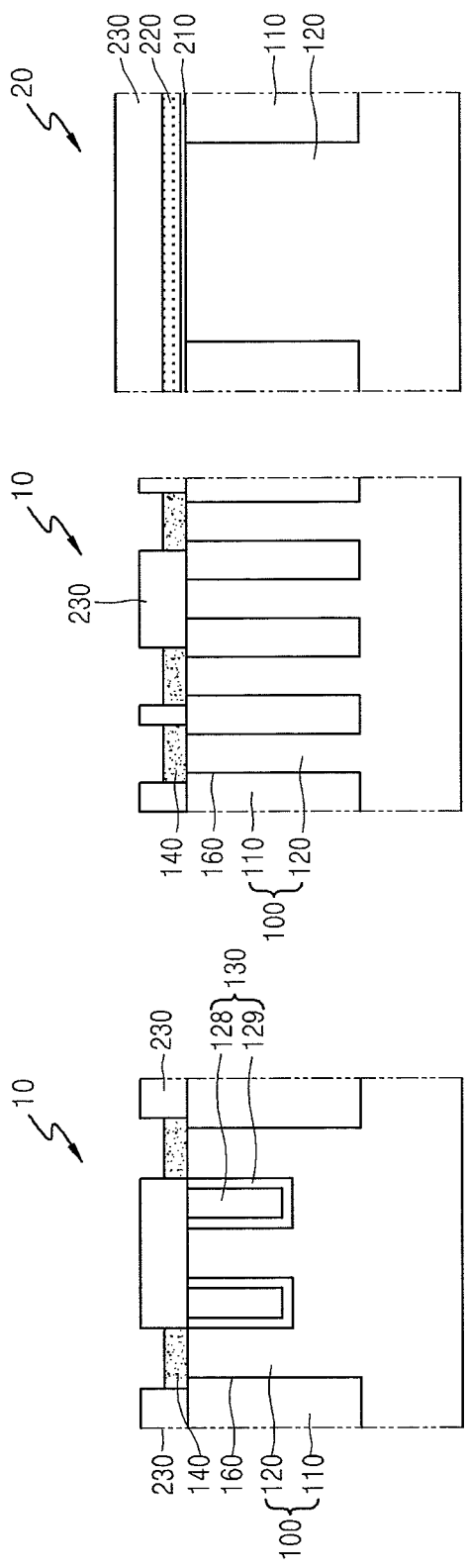

Referring to FIG. 4D, the first contact plug 140 may be formed to cover the contact hole (235 of FIG. 4C). An etchback process may be performed with respect to a conductive material, such that the conductive material fills the contact hole (235 of FIG. 4C) to form the first contact plug 140 and the top surface of the conductive material is evenly level with or lower than the first interlayer insulation layer 230. The conductive material may be the same material constituting the gate conductive layer 220 of the peripheral region 20 or may be a different material. The structure of the first contact plug 140 is merely an example. Alternatively, a chemical mechanical polishing (CMP) process may be performed with respect to the conductive material, such that the top surface of the conductive material is evenly level with the first interlayer insulation layer 230.

Figure 4E:
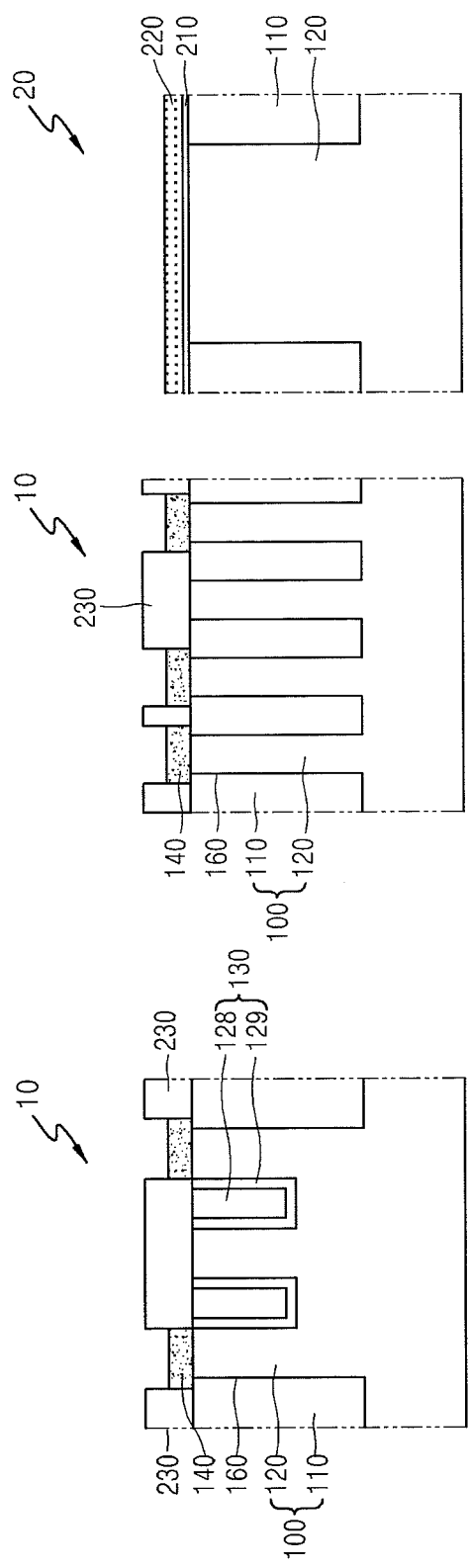

Referring to FIG. 4E, the first interlayer insulation layer 230 formed on the portion of the gate conductive layer 220 in the peripheral region 20 of the substrate 100 may be removed via a wet etching process, for example. The cell region 10 of the substrate 100 may be covered by a photoresist (not shown), such that only the portion of the first interlayer insulation layer 230 in the peripheral region 20 of the substrate 100 is removed. Therefore, etching of the portion of the first interlayer insulation layer 230 formed in the cell region 10 of the substrate 100 may be avoided due to the cell region 10 being covered with the photoresist. After the wet-etching process is performed and the photoresist of the peripheral region 20 is removed, the first contact plug 140 in the cell region 10 of the substrate 100 and the gate conductive layer 220 on the peripheral region 20 of the substrate 100 may be simultaneously exposed.

Figure 4F:
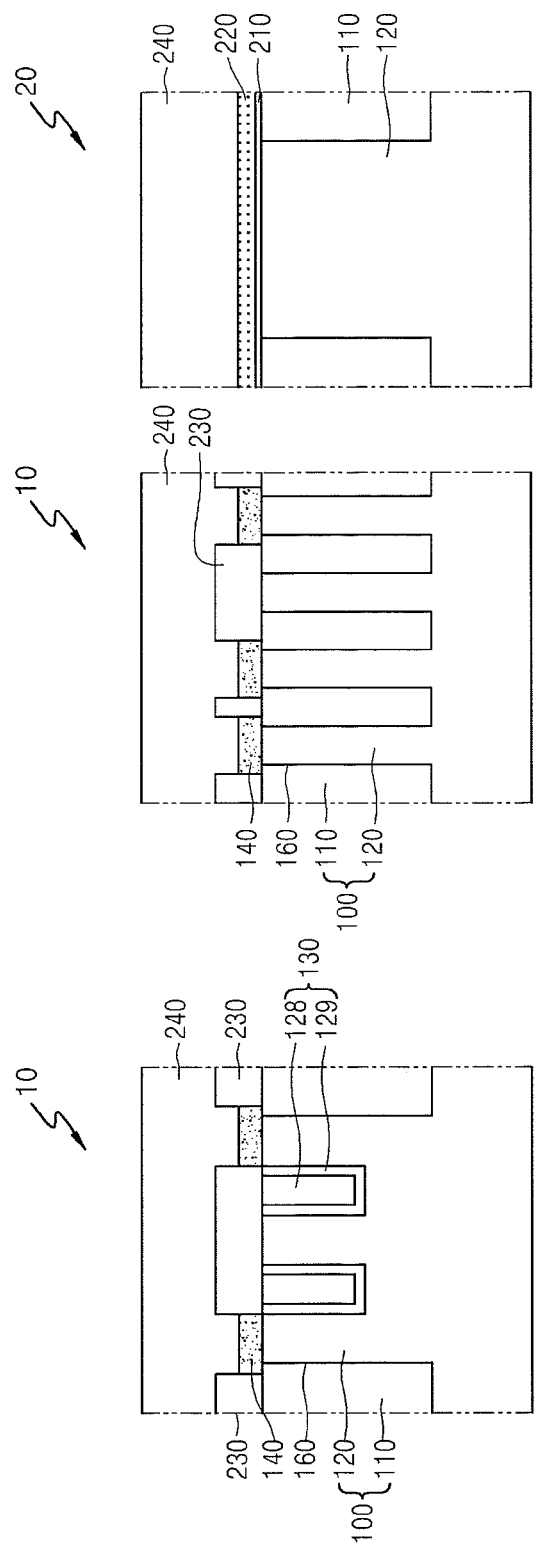

Referring to FIG. 4F, the second interlayer insulation layer 240 may be formed on the first interlayer insulation layer 230 and the first contact plug 140 in the cell region 10 and on the gate conductive layer 220 on the peripheral region 20. The second interlayer insulation layer 240 may be formed of the same material as the first interlayer insulation layer 230 or a different material.

Figure 4G:
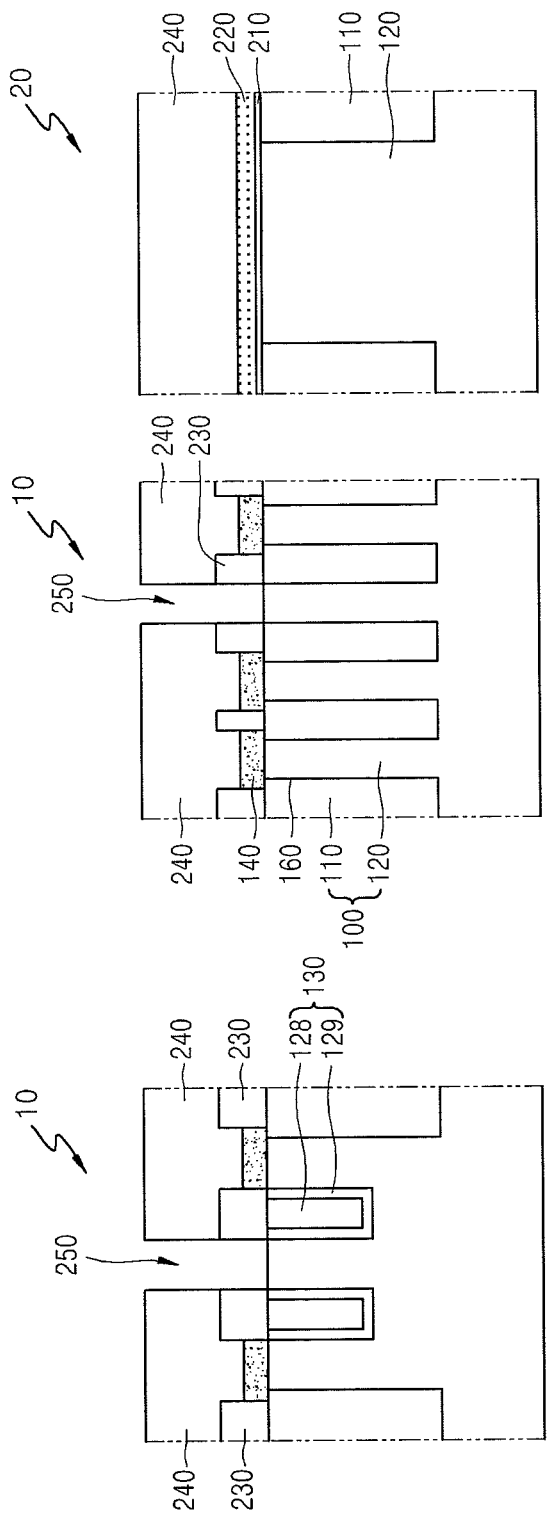

Referring to FIG. 4G, a contact hole 250 may be formed to expose the center region of the active region 120 by sequentially patterning the portion of the second interlayer insulation layer 240 and the portion of the first interlayer insulation layer 230 in the cell region. The peripheral region 20 of the substrate 100 may be covered by a photoresist (not shown). Therefore, patterning of the portion of the second interlayer insulation layer 240 formed in the peripheral region 20 of the substrate 100 may be avoided due to the peripheral region 20 being covered with the photoresist.

Figure 4H:
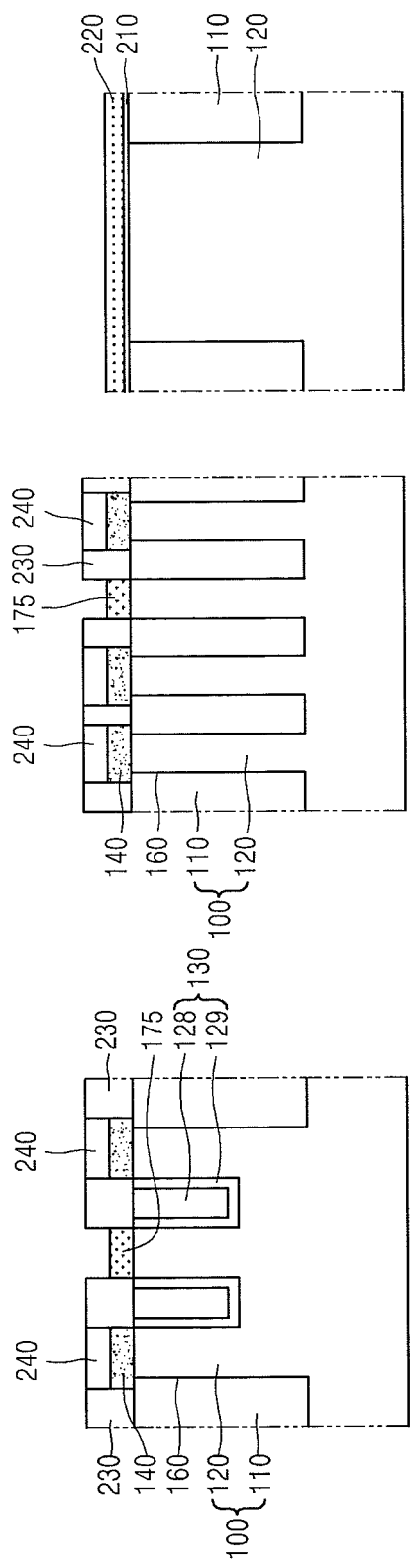

Referring to FIG. 4H, the third contact plug 175 may be formed to cover the contact hole (250 of FIG. 4G). A conductive material may filled into the contact hole (250 of FIG. 4G) and an etch-back process or a CMP process may be performed with respect to the conductive material to form the third contact plug 175. An etch-back process or a CMP process may be performed with respect to the conductive material such that the top surface of the third contact plug 175 is evenly level with the top surface of the first contact plug 140. Removing of the first contact plug 140 by the etch-back process may be avoided due to the second interlayer insulation layer 240 remaining on the first contact plug 140.

The second interlayer insulation layer 240 may be partially removed, such that the top surface of the first interlayer insulation layer 230 and the top surface of the second interlayer insulation layer 240 are evenly level with each other. The top surface of the first interlayer insulation layer 230 and the top surface of the second interlayer insulation layer 240 may be made to be evenly level with each other by performing a CMP process with respect to the second interlayer insulation layer 240 until the first interlayer insulation layer 230 is exposed. The second interlayer insulation layer 240 in the peripheral region 20 may be removed by performing an etch-back process or a CMP process, and thus the portion of the gate conductive layer 220 in the peripheral region 20 may be exposed.

Figure 4I:
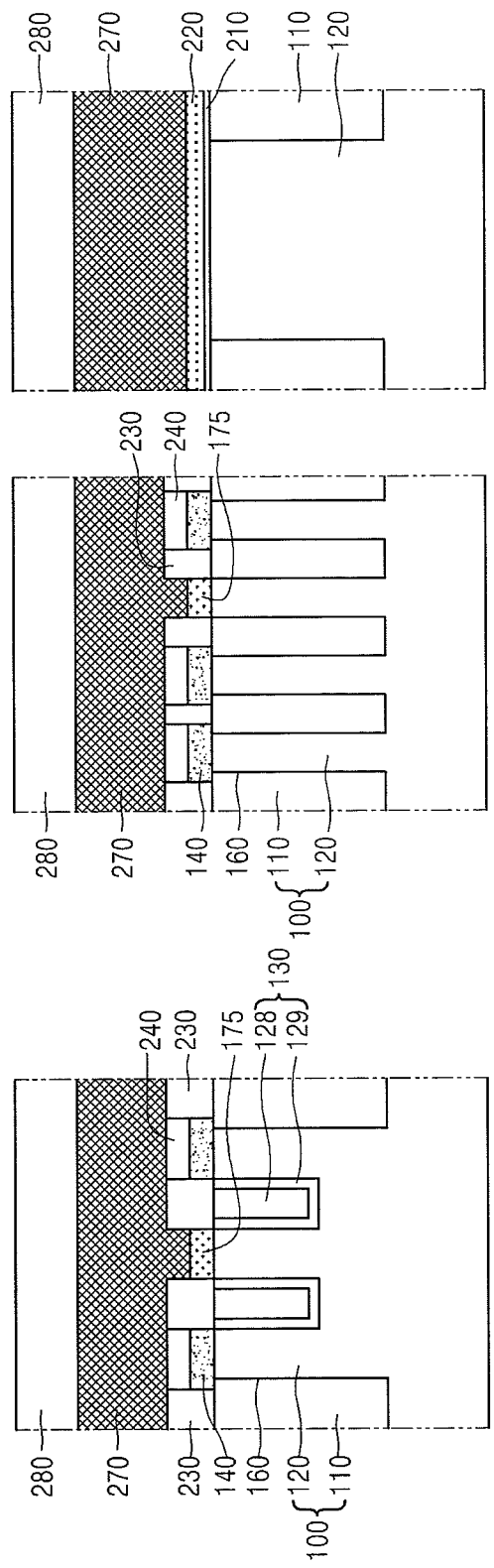

Referring to FIG. 4I, a conductive layer 270 and an insulation layer 280 may be sequentially formed in the cell region 10 and the peripheral region 20 of the substrate 100. The conductive layer 270 contacting the third contact plug 175 may be formed on the third contact plug 175 and the first and second interlayer insulation layers 230 and 240 in the cell region 10. The conductive layer 270 contacting the gate conductive layer 220 may be formed on the gate conductive layer 220 in the peripheral region 20. The conductive layer 270 may be formed of the same material as the first and second contact plugs 140 and 175. The insulation layer 280 may be formed of a material having different etching ratio from the materials of the first and second interlayer insulation layers 230 and 240.

Figure 4J:
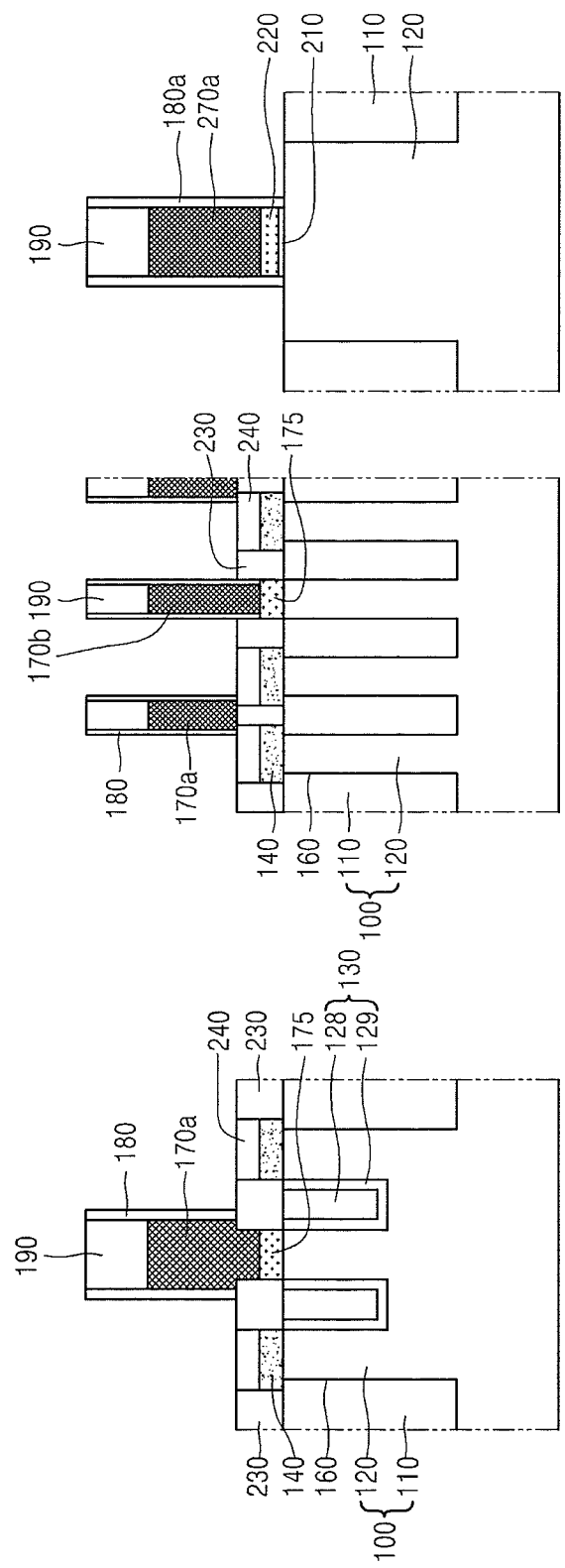

Referring to FIG. 4J, the capping insulation layer 190 may be formed by patterning the insulation layer 280. The conductive layer 270 may be patterned to form the first and second bitlines 170a and 170b in the cell region 10 and to form a gate electrode 270a in the peripheral region. The first and second bitlines 170a and 170b in the cell region 10 and the gate electrode 270a in the peripheral region may be formed in the same process. The height of the first and second bitlines 170a and 170b in the cell region 10 and the height of the gate electrode 270a in the peripheral region may be substantially the same. The first and second bitlines 170a and 170b in the cell region 10 and the gate electrode 270a in the peripheral region may be formed of the same material.

Next, the first spacer 180 surrounding sidewalls of the first and second bitlines 170a and 170b and a second spacer 180a surrounding sidewalls of the gate electrode 270a may be formed. The first spacer 180 in the cell region 10 and the second spacer 180a in the peripheral region 20 may be simultaneously formed. The first spacer 180 in the cell region 10 and the second spacer 180a in the peripheral region 20 may be formed of the same material. The thickness of the first spacer 180 and the thickness of the second spacer 180a may be substantially the same.

Figure 4K:
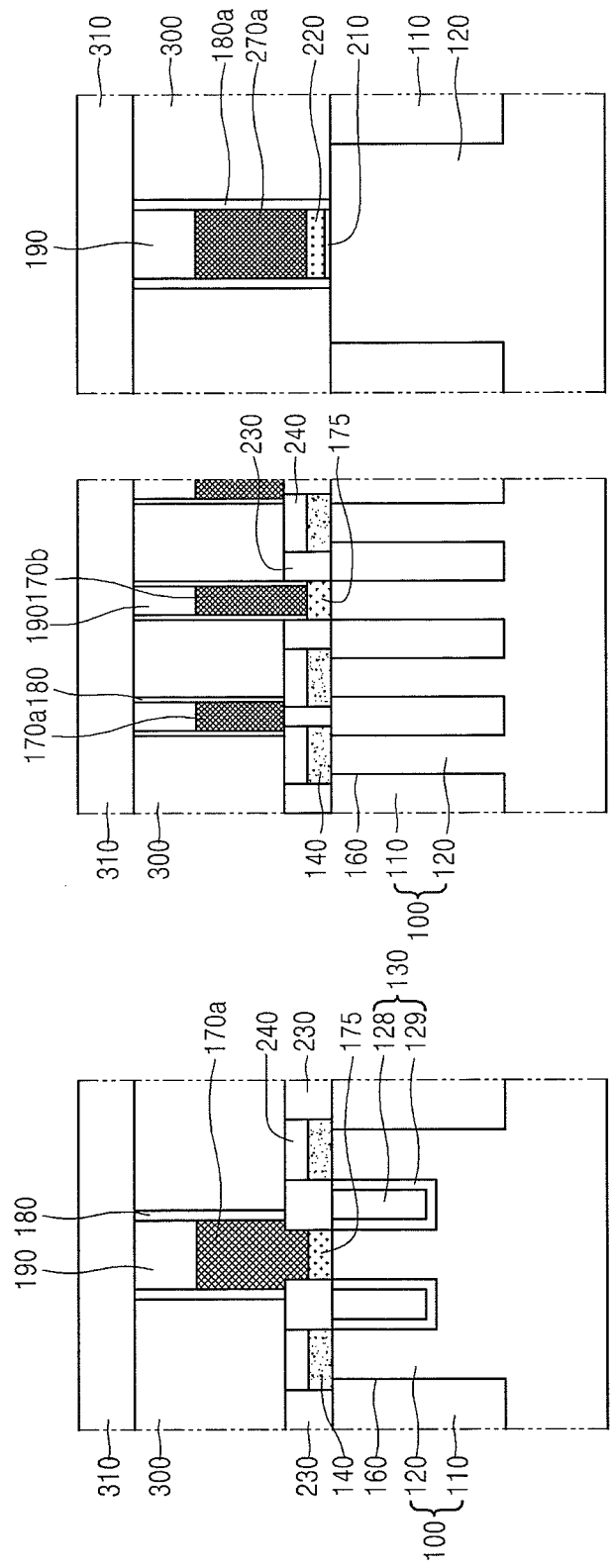

Referring to FIG. 4K, the third interlayer insulation layer 300 may be formed on the first and second interlayer insulation layers 230 and 240 in the cell region 10 and on the active region 120 and the device isolation layer 110 in the peripheral region 20. The third interlayer insulation layer 300 may be formed of the same material as the first and second interlayer insulation layers 230 and 240. Next, a CMP process may be performed with respect to the third interlayer insulation layer 300 until top surfaces of the capping insulation layers 190 in the cell region 10 and in the peripheral region 20 are exposed. The capping insulation layers 190 in the cell region 10 and in the peripheral region 20 may have the same height. Next, the fourth interlayer insulation layer 310 may be formed on the third interlayer insulation 300 and the capping insulations layers 190 in the cell region 10 and the peripheral region 20. The fourth interlayer insulation layer 310 may be formed of the same material as the third interlayer insulation layer 300.

Figure 4L:
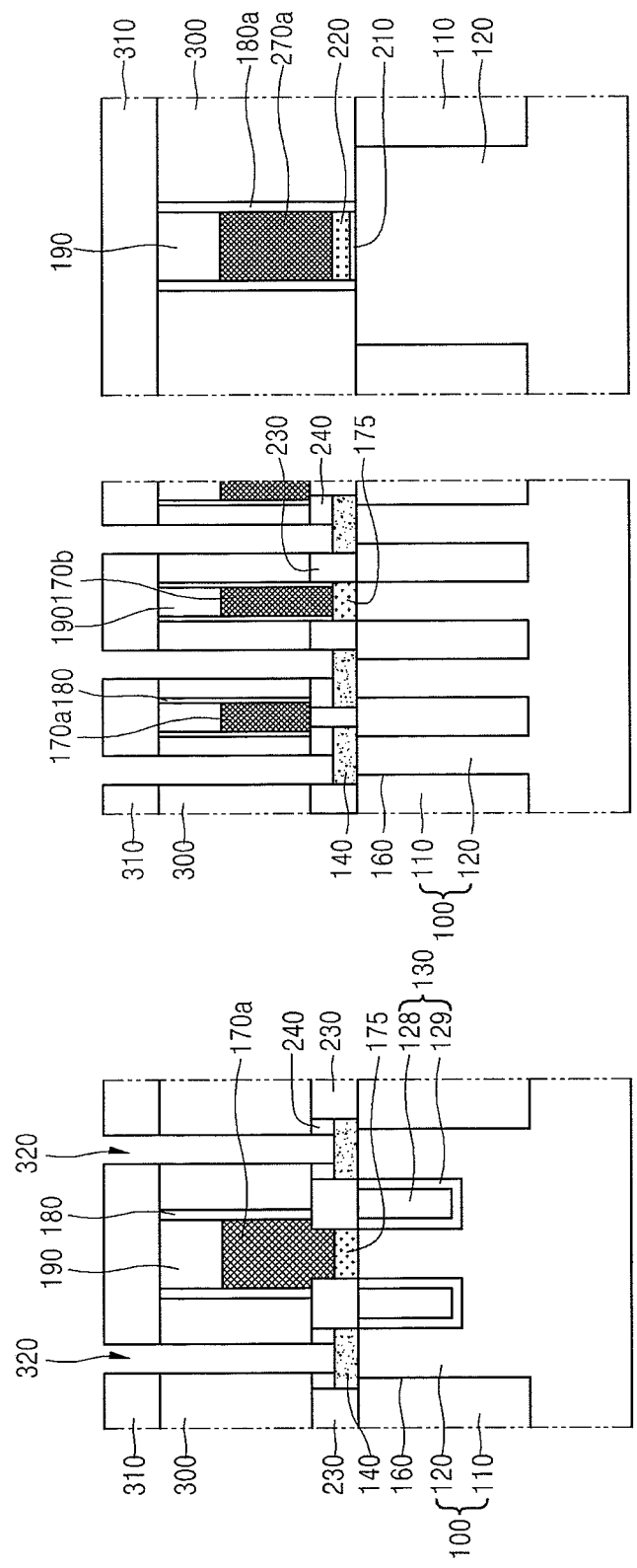

Referring to FIG. 4L, a contact hole 320 may be formed to expose the top surface of the first contact plug 140 in the cell region 10 by patterning the fourth interlayer insulation layer 310, the third interlayer insulation layer 300, and the second interlayer insulation layer 240 in the cell region 10. The peripheral region 20 of the substrate 100 may be covered by a photoresist (not shown). Therefore, patterning of the fourth interlayer insulation layer 310 and the third interlayer insulation layer 300 in the peripheral region 20 of the substrate 100 may be avoided due to the covering of the peripheral region 20 with the photoresist.

Figure 4M:
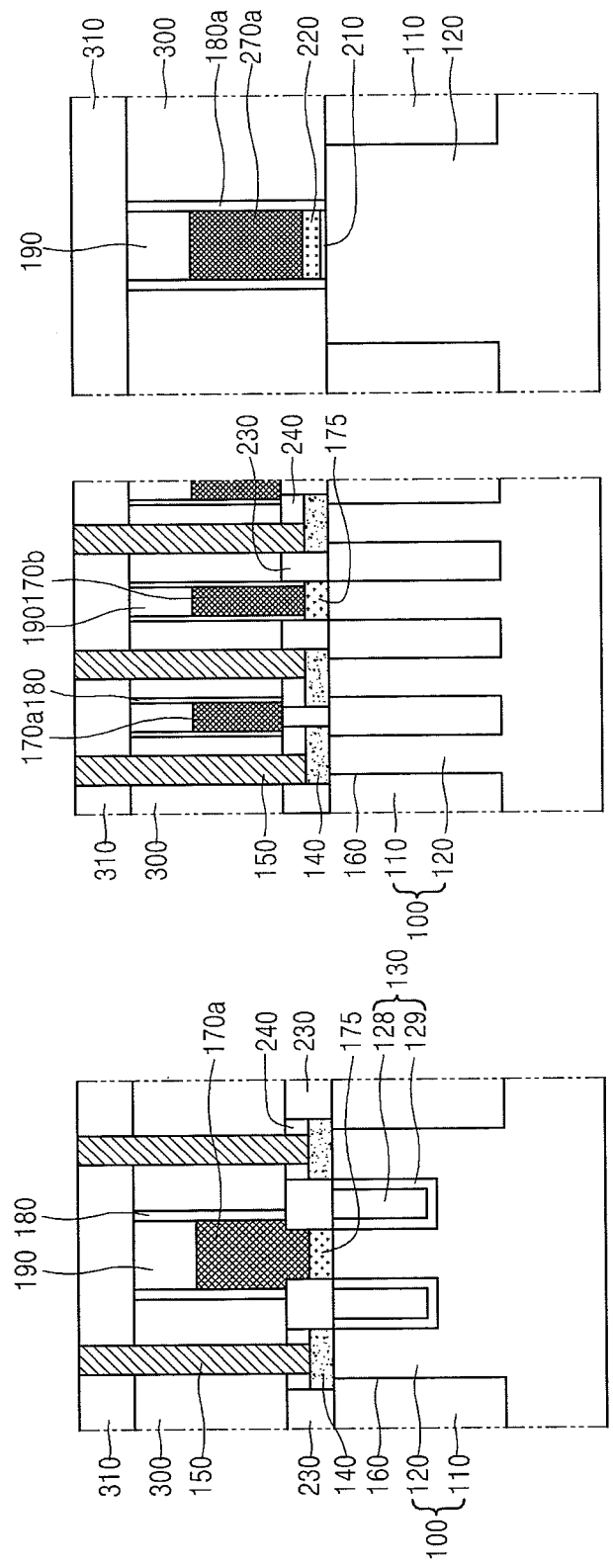

Referring to FIG. 4M, the second contact plug 150 may be formed to cover the contact hole (320 of FIG. 4L). A conductive material may be filled into the contact hole (320 of FIG. 4L), and an etch-back process or a CMP process may be performed with respect to the conductive material. As a result, the second contact plug 150 may be formed.

By way of summation and review, as the area of a unit cell, such as a dynamic random access memory (DRAM) memory cell, decreases due to increased integration of semiconductor devices and patterning process techniques, misalignment may occur during the patterning process. Due to the misalignment, a contacting area between a storage contact plug and an active region may be reduced, and thus reliability of a semiconductor device may be deteriorated. Embodiments of a semiconductor device and method of fabricating the semiconductor device described above may prevent a reduction of a contacting area between a storage contact plug and an active region due to a misalignment. For example, without limiting other aspects and without being bound to a particular theory, providing a first contact plug that has a greater length in a second direction than an active area on which the first contact plug is formed and a greater length in the second direction than a second contact plug that is provided on the first contact plug may help to prevent such misalignment.

Figure 5:
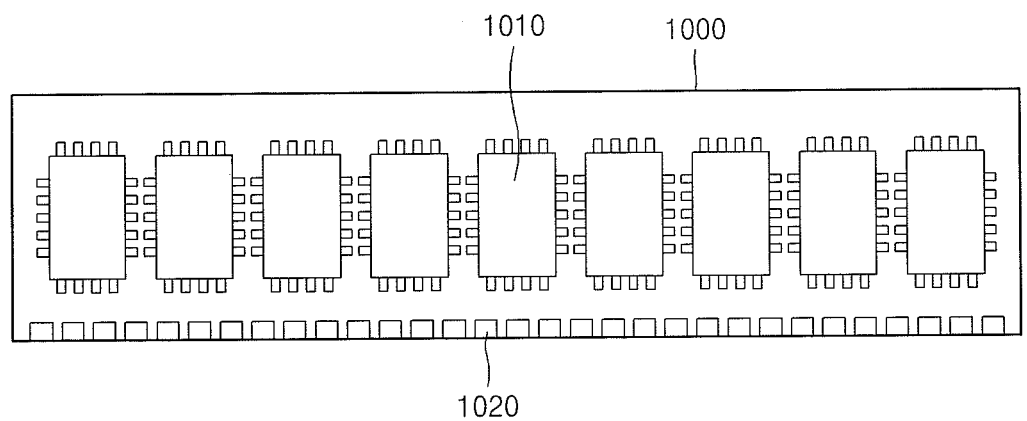
FIG. 5 illustrates a front view of a memory module including a memory device, according to an embodiment.

FIG. 5 is a front view of a memory module 1000 including a memory device, according to an embodiment.

Referring to FIG. 5, the memory module 1000 may include a plurality of memory chips 1010 and a plurality of external terminals 1020. Each of the plurality of memory chips 1010 may include the memory device shown in FIG. 1. The external terminals 1020 may be electrically connected to the memory devices within the memory chips 1010, respectively. The external terminals 1020 may be connected to a computer system (not shown) and may transmit control signals, address signals, and data signals from the computer system to the memory devices. Furthermore, the external terminals 1020 may transmit data signals stored in the memory devices in the memory chips 1010 to the computer system.

Figure 6:
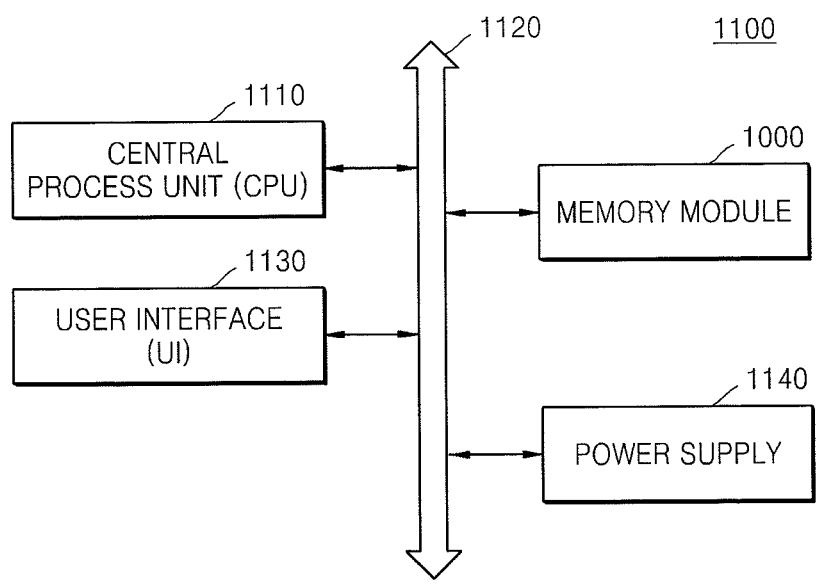
FIG. 6 illustrates a block diagram of a computer system including the memory module of FIG. 5, according to an embodiment.

FIG. 6 is a block diagram of a computer system 100 including the memory module (1000 of FIG. 5), according to an embodiment.

Referring to FIG. 6, the computer system 1100 may include a central processing unit (CPU) 1110, a user interface (UI) 1130, a power supply (1140), and the memory module 1000.

The memory module 1000 may be electrically connected to the CPU 1110, the UI 1130, and the power supply 1140 via a system bus 1120. Data either provided by the UI 1130 or processed by the CPU 1110 may be stored in the memory module 1000. Although not shown, the computer system 1100 may further include an application chipset, a camera image processor, or the like.

While has aspects have been particularly shown and described with reference to exemplary embodiments thereof, it will be understood that various changes in form and details may be made therein without departing from the spirit and scope of the following claims.

What is claimed is:

1. A semiconductor device comprising:
   a plurality of active regions that are separated from each other on a substrate by a device isolation layer and that extend in a first direction, the active regions having two opposite ends and a center region;
   wordlines that are buried in the active regions between two opposite ends of the active regions and center regions of the active regions cross the active regions and extend in a second direction, which is different from the first direction;
   first contact plugs on the two opposite ends of the active regions, each first contact plug overlapping a border between the active region and the device isolation layer; and
   second contact plugs on the first contact plugs,
   wherein a first contact plug on an end of the two opposite ends and a second contact plug on the end constitute an integrated contact plug configured to provide electrical connection between the end and a storage element on the second contact plug.

2. The semiconductor device as claimed in claim 1, wherein a length of each of the first contact plugs in the second direction is greater than a length of each of the active regions in the second direction.

3. The semiconductor device as claimed in claim 1, wherein a length of each of the first contact plugs in the second direction is greater than a length of each of the second contact plugs in the second direction.

4. A semiconductor device, comprising:
   a plurality of active regions that are separated from each other on a substrate by a device isolation layer and that extend in a first direction, the active regions having two opposite ends and a center region;
   wordlines that are buried in the active regions between two opposite ends of the active regions and center regions of the active regions cross the active regions and extend in a second direction, which is different from the first direction;
   first contact plugs on the two opposite ends of the active regions, each first contact plug overlapping a border between the active region and the device isolation layer;
   second contact plugs on the first contact plugs, and
   third contact plugs on the center regions of the active regions,
   wherein, in a direction perpendicular to the first direction and the second direction, a height of the third contact plugs and a height of the first contact plugs are substantially the same.

5. A semiconductor device, comprising:
   a plurality of active regions that are separated from each other on a substrate by a device isolation layer and that extend in a first direction, the active regions having two opposite ends and a center region;
   wordlines that are buried in the active regions between two opposite ends of the active regions and center regions of the active regions cross the active regions and extend in a second direction, which is different from the first direction;
   first contact plugs on the two opposite ends of the active regions, each first contact plug overlapping a border between the active region and the device isolation layer; and
   second contact plugs on the first contact plugs, wherein:
   on a section obtained along a centerline of the first contact plugs that are adjacent to each other in the second direction, some of the second contact plugs are arranged substantially along first ends of respective first contact plugs to form L-shaped contact plugs, and
   on the section obtained along the centerline of the first contact plugs that are adjacent to each other in the second direction, others of the second contact plugs are arranged substantially along second ends of respective first contact plugs to form reversed L-shaped contact plugs.

6. The semiconductor device as claimed in claim 5, further comprising a first bitline on the device isolation layer, wherein on the section obtained along the centerline of the first contact plugs that are adjacent to each other in the second direction, at least one of the L-shaped contact plugs and at least one of the reverse L-shaped contact plugs are symmetrical to each other about the first bitline.

7. The semiconductor device as claimed in claim 5, further comprising a second bitline in the active region, wherein on the section obtained along the centerline of the first contact plugs that are adjacent to each other in the second direction,
at least one of the L-shaped contact plugs and at least one of the reverse L-shaped contact plugs are symmetrical to each other about the second bitline.

8. The semiconductor device as claimed in claim 7, wherein the first contact plugs have an elliptical shape.

9. A semiconductor device having a cell region and a peripheral region, wherein the cell region comprises:
a plurality of active regions that are separated from each other on a substrate by a device isolation layer and extend in a first direction;
wordlines that are buried in the active regions between two opposite ends of the active regions and center regions of the active regions cross the active regions and extend in a second direction, which is different from the first direction;
first contact plugs on the two opposite ends of the active regions; and
second contact plugs on the first contact plugs, and
each of the first contact plugs overlaps a border between the two opposite ends of the active regions and the device isolation layer.

10. The semiconductor device as claimed in claim 9, wherein a length of each of the first contact plugs in the second direction is greater than a length of each of the active regions in the second direction.

11. The semiconductor device as claimed in claim 9, wherein a length of each of the first contact plugs in the second direction is greater than a length of each of the second contact plugs in the second direction.

12. The semiconductor device as claimed in claim 9, wherein the cell region further comprises:
third contact plugs on the center regions of the active regions; and
a plurality of bitlines that are on the third contact plugs and that extend in a direction perpendicular to the second direction, and wherein
the peripheral region comprises:
at least one active region isolated on the substrate by a device isolation layer;
a gate insulation layer on the active region; and
a gate electrode on the gate insulation layer,
wherein a height of each of the bitlines and a height of the gate electrode are substantially the same.

13. The semiconductor device as claimed in claim 12, wherein the bitlines in the cell region and the gate electrode in the peripheral region include a same material.

14. The semiconductor device as claimed in claim 12, wherein the peripheral region further comprises a gate conductive layer between the gate insulation layer and the gate electrode, and
the gate conductive layer and the first contact plugs include a same material.

15. The semiconductor device as claimed in claim 12, wherein the cell region further comprises first spacers surrounding sidewalls of the bitlines,
the peripheral region further comprises second spacers surrounding sidewalls of the gate electrode, and
the thickness of the first spacers and the thickness of the second spacers are substantially the same.

16. A semiconductor device comprising:
a plurality of active regions that are separated from each other on a substrate by a device isolation layer and extend in a first direction;
wordlines that are buried in the active regions between two opposite ends of the active regions and center regions of the active regions cross the active regions and extend in a second direction, which is different from the first direction;
first contact plugs formed on the two opposite ends of the active regions; and
second contact plugs formed on the first contact plugs, and
wherein each of the first contact plugs overlaps a border between the two opposite ends of the active regions and the device isolation layer,
the first contact plugs comprises a first set of first contact plugs arranged along a first reference line perpendicular to the second direction and a second set of first contact plugs arranged along a second reference line parallel to the first reference line,
the second contact plugs are arranged along a third reference line parallel to the first and second reference lines, and
the first reference line and the second reference line are symmetrical to each other about the third reference line.

17. The semiconductor device as claimed in claim 16, wherein the first set of first contact plugs are arranged such that centers thereof are aligned along the first reference line,
the second set of first contact plugs are arranged such that centers thereof are aligned along the second reference line, and
the second contact plugs are arranged such that centers thereof are aligned along the third reference line.

18. The semiconductor device as claimed in claim 16, wherein, a length of each of the first contact plugs in the second direction is greater than a length of each of the active regions in the second direction.

19. The semiconductor device as claimed in claim 16, wherein a length of each of the first contact plugs is greater than a length of each of the second contact plugs in the second direction.

* * * * *